(12) United States Patent
Onizuka et al.

(10) Patent No.: US 8,035,541 B2
(45) Date of Patent: Oct. 11, 2011

(54) DIGITAL-ANALOG CONVERTER CIRCUIT, SOLID-STATE IMAGING DEVICE, AND IMAGING APPARATUS

(75) Inventors: Masatsugu Onizuka, Kanagawa (JP); Masaru Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/511,155

(22) Filed: Jul. 29, 2009

(65) Prior Publication Data
US 2010/0052965 A1    Mar. 4, 2010

(30) Foreign Application Priority Data
Sep. 1, 2008   (JP) .................................. 2008-224165

(51) Int. Cl.
H03M 1/62   (2006.01)
H03M 1/84   (2006.01)
(52) U.S. Cl. ........................................ 341/139; 341/144
(58) Field of Classification Search .................. 341/155, 341/144, 139
See application file for complete search history.

(56) References Cited

U.S. PATENT DOCUMENTS

| | | | | |
|---|---|---|---|---|
| 5,953,123 A | * | 9/1999 | Jaklitsch et al. | 356/464 |
| 6,304,139 B1 | * | 10/2001 | Kanno | 330/133 |
| 6,863,388 B2 | * | 3/2005 | Seino et al. | 347/86 |
| 6,868,262 B2 | * | 3/2005 | Gonya, Sr. | 455/234.1 |
| 7,132,818 B2 | * | 11/2006 | Matsuura | 323/222 |
| 2007/0194962 A1 | | 8/2007 | Asayama et al. | |

FOREIGN PATENT DOCUMENTS

| | | |
|---|---|---|
| JP | 2000-152082 | 5/2000 |
| JP | 2002-232291 | 8/2002 |
| JP | 2007-059991 | 3/2007 |
| JP | 2008-136042 | 6/2008 |

* cited by examiner

*Primary Examiner* — Peguy JeanPierre
(74) *Attorney, Agent, or Firm* — Robert J. Depke; Rockey, Depke & Lyons, LLC (57) ABSTRACT

A digital-analog converter circuit includes: a first digital-analog conversion part that obtains an analog output signal in response to a value of a digital input signal; and a second digital-analog conversion part that generates a control signal in response to a value of a digital gain control input signal externally input, wherein the first digital-analog conversion part adjusts a start voltage or end voltage of the analog output signal based on the digital gain control input signal for controlling the second digital-analog conversion part.

6 Claims, 7 Drawing Sheets

DIGITAL-ANALOG CONVERTER CIRCUIT, SOLID-STATE IMAGING DEVICE, AND IMAGING APPARATUS

The present application claims priority to Japanese Patent Application JP 2008-224165 filed in the Japan Patent Office on Sep. 1, 2008, the entire contents of which are hereby incorporated by reference.

BACKGROUND OF THE INVENTION

1. Field of the Invention

The present invention relates to a digital-analog converter circuit that generates a ramp signal, a solid-state imaging device, and an imaging apparatus.

2. Background Art

Digital-analog (D/A) converter devices that convert digital signals into analog signals are used in many electronic devices.

For example, CCD (Charge Coupled Device)-type that detects light or MOS (Metal Oxide Semiconductor)-type and CMOS (Complementary Metal-Oxide Semiconductor)-type semiconductor devices are used in an imaging apparatus. An imaging apparatus is an apparatus that converts and reads out a light distribution into electric signals using pixels.

Further, among CMOS-type imaging apparatuses, there is an amplification-type imaging apparatus including pixels having active pixel sensors (APS) with drive transistors for amplification in pixel signal generating parts that generate pixel signals according to signal charge generated in charge generating parts.

In the imaging apparatus, address-control is performed on a pixel unit in which plural unit pixels are arranged, the signals from the individual unit pixels are arbitrarily selected, and thereby, pixel signals output by the individual unit pixels are read out.

For example, in an address-type imaging device in which unit pixels are arranged in a matrix, the pixels include active elements having MOS structures (MOS transistors) or the like for amplification functions of themselves. That is, signal charge (photoelectrons) accumulated in photodiodes as photoelectric conversion elements are amplified by the active elements and output as pixel signals.

The analog pixel signals read out from the pixel unit are generally converted by an analog-digital (A/D) converter device into digital signals and output.

There are various A/D conversion systems of pixel signals in view of circuit size, processing speed, resolution, etc. For example, one of the A/D conversion systems is a method of comparing analog pixel signals with a reference signal, counting time necessary for comparison, and converting the analog pixel signals into digital signals based on a count value at completion of the comparison processing. Such an A/D conversion system is called single-slope integration-type or ramp signal comparison-type.

As imaging devices utilizing the A/D conversion system, there are technologies disclosed in JP-A-2000-152082, JP-A-2002-232291, and JP-A-2007-59991, for example.

In the A/D conversion system, the reference signal is a saw-tooth signal (ramp signal) that monotonously changes, and a D/A converter circuit may be used for generating a ramp signal.

SUMMARY OF THE INVENTION

In the above described single-slope integration-type A/D conversion system, gain adjustment can be made to analog pixel signals by changing the gradient of the reference signal to be supplied to a comparator circuit that compares the analog pixel signals with the reference signal.

However, even if the gain adjustment is made by controlling the gradient of the reference signal as described above, the current source configuration of the D/A converter circuit that generates a start voltage of the reference signal is fixed, and thus, in design with an expanded P-phase range for a period of high gain, redundancy is caused in the P-phase range in a low-gain period.

That is, in the low-gain period, there are disadvantage that the drain-source voltage of the current source is not sufficiently secured due to unnecessarily increased output amplitude and the analog characteristic of the ramp waveform in the reference signal becomes deteriorated.

Thus, it is desirable to provide a D/A converter circuit that improves the analog characteristic of the ramp waveform in the reference signal, a solid-state imaging device, and an imaging apparatus.

A digital-analog converter circuit according to an embodiment of the invention includes a first digital-analog conversion part that obtains an analog output signal in response to a value of a digital input signal, and a second digital-analog conversion part that generates a control signal in response to a value of a digital gain control input signal externally input, wherein the first digital-analog conversion part adjusts a start voltage or end voltage of the analog output signal based on the digital gain control input signal for controlling the second digital-analog conversion part.

A solid-state imaging device according to another embodiment of the invention includes a pixel unit that has plural pixels and outputs analog pixel signals, a digital-analog converter circuit that generates a ramp signal having a predetermined initial voltage and a fixed gradient, and an analog-digital converter unit that compares the analog pixel signals output by the pixel unit with the ramp signal generated by the digital-analog converter circuit and digitally converts the analog pixel signals based on a comparison time, wherein the digital-analog converter circuit has a first digital-analog conversion part that obtains an analog output signal in response to a value of a digital input signal and a second digital-analog conversion part that obtains an analog gain control output signal in response to a value of a digital gain control input signal, and adjusts a start voltage or end voltage of the first digital-analog conversion part based on the digital gain control input signal controlling the second digital-analog conversion part.

An imaging apparatus according to another embodiment of the invention includes a solid-state imaging device having plural pixels, and an optical system that focuses light from a subject onto the pixels of the solid-state imaging device, wherein the solid-state imaging device includes a pixel unit that has plural pixels and outputs analog pixel signals, a digital-analog converter circuit that generates a ramp signal having a predetermined initial voltage and a fixed gradient, and an analog-digital converter unit that compares the analog pixel signals output by the pixel unit with the ramp signal generated by the digital-analog converter circuit and digitally converts the analog pixel signals based on a comparison time, and the digital-analog converter circuit has a first digital-analog conversion part that obtains an analog output signal in response to a value of a digital input signal and a second digital-analog conversion part that obtains an analog gain control output signal in response to a value of a digital gain control input signal, and adjusts a start voltage or end voltage of the first digital-analog conversion part based on the digital gain control input signal controlling the second digital-analog conversion part.

According to the embodiments of the invention, the analog characteristic of the ramp waveform in the reference signal can be improved.

DESCRIPTION OF PREFERRED EMBODIMENT

Hereinafter, a CMOS sensor 100 according to an embodiment of the invention will be explained.

Figure 1:
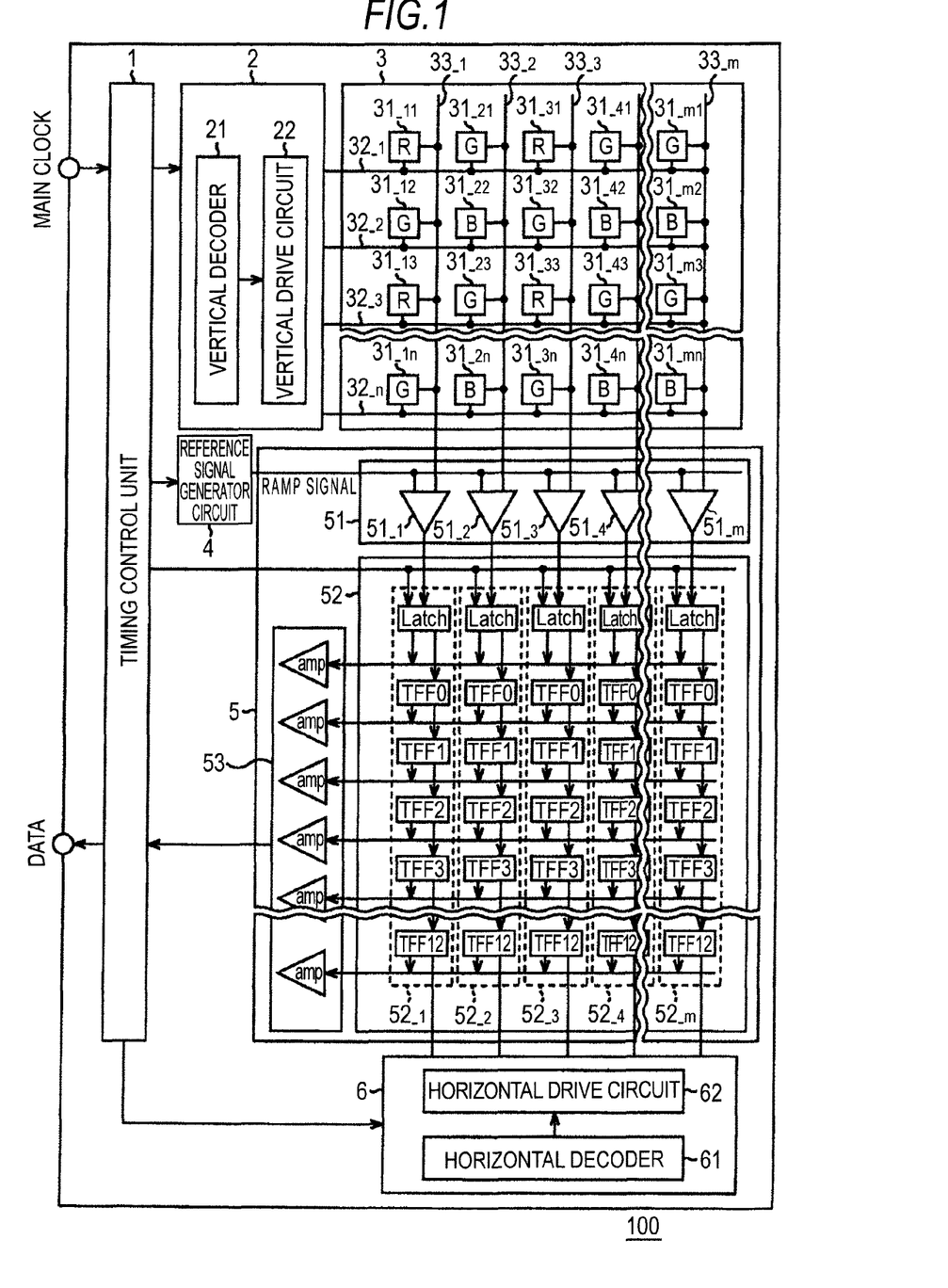
FIG. 1 is a block diagram showing a configuration example of a CMOS sensor according to an embodiment of the invention.

FIG. 1 is a block diagram showing a configuration example of the CMOS sensor 100 according to the embodiment of the invention.

As shown in FIG. 1, the CMOS sensor 100 has a timing control unit 1, a vertical scan circuit 2, a pixel array 3, a reference signal generator circuit 4, a column A/D (Analog to Digital) converter unit 5, and a horizontal transfer scan circuit 6.

The pixel array 3 corresponds to a pixel unit of an embodiment of the invention.

The reference signal generator circuit 4 corresponds to a digital-analog connector circuit of the embodiment of the invention.

The column A/D converter unit 5 corresponds to an analog-digital convertor unit of the embodiment of the invention.

The timing control unit 1 has a logic control circuit, a PLL circuit (CLK divider), a timing control circuit, a communication interface, etc., and a main clock is supplied from an external circuit (not shown) to the timing control unit 1.

The timing control unit 1 outputs control signals and clock signals for controlling the respective components of the CMOS sensor 100.

The vertical scan circuit 2 includes a vertical decoder 21 and a vertical drive circuit 22, and sequentially controls pixels arranged in the vertical direction of the pixel array 3 with predetermined timings according to the control signals from the timing control unit 1 to output pixel signals.

For example, when pixels in a predetermined row are thinned from the pixels of the pixel array 3 and pixel signals are output from the pixels in the remaining rows, the vertical decoder 21 generates and supplies a signal for selecting the rows that output pixel signals to the vertical drive circuit 22.

The vertical drive circuit 22 generates and supplies control signals for driving the pixels of the pixel array 3, i.e., selection signals, reset signals, and trigger signals to the pixel array 3.

The pixel array 3 has pixels 31_11 to 31_mn in number of m×n in the lateral and longitudinal directions, n row control lines 32_1 to 32_n, and m vertical signal lines 33_1 to 33_m. Note that m and n are positive integer numbers.

The pixels 31_1 to 31_mn are connected to the vertical scan circuit 2 via the row control lines 32_1 to 32_n and connected to the column A/D converter unit 5 via the vertical signal lines 33_1 to 33_m.

The pixels 31_11 to 31_mn are arranged to follow Bayer arrangement, for example, so as to receive three colors of light (RGB), and outputs pixel signals to the vertical signal lines 33_1 to 33_m according to the control signals supplied via the row control lines 32_1 to 32_n from the vertical scan circuit 2.

In the pixel array 3, not only an available image area as an available area for taking in images but also a reference pixel area for providing optical black is provided around the available image area.

As an example, several rows (e.g., one to ten rows) of reference pixels for providing optical black are arranged in the upper and lower parts in the vertical column direction, and further, several pixels to several tens of pixels (e.g., three to forty pixels) of reference pixels for providing optical black are arranged in the right and left parts in the horizontal rows containing the available image area.

Regarding the reference pixels for providing optical black, the light receiving surface side thereof is shielded from light so that light may not enter charge generating parts having photodiodes etc. The pixel signals form the reference pixels are used as reference of black in video signals.

The reference signal generator circuit 4 generates a reference signal (ramp signal) in which a voltage drops from a predetermined initial voltage at a fixed gradient based on the control signals for controlling gain and offset and clock signals at a predetermined frequency supplied from the timing control unit 1.

The details of the reference signal generator circuit 4 will be described later.

The reference signal generator circuit 4 supplies the generated reference signal to the column A/D converter unit 5.

The column A/D converter unit 5 includes a voltage comparison part 51, an A/D conversion part 52, and a sensitivity amplification part 53.

The voltage comparison part 51 has m comparators 51_1 to 51_m.

To the comparators 51_1 to 51_m, pixel signals are supplied from the pixels 31_11 to 31_mn via the vertical signal lines 33_1 to 33_m, respectively, and the ramp signal is supplied from the reference signal generator circuit 4.

The comparators 51_1 to 51_m compare the pixel signals supplied via the vertical signal lines 33_1 to 33_m with the ramp signal supplied from the reference signal generator circuit 4, and supplies comparison result signals representing the comparison results to the A/D conversion part 52.

That is, the comparator 51_1 compares the pixel signals sequentially supplied from the pixels 31_11 to 31_1n in the first column via the vertical signal line 33_1 with the ramp signal supplied from the reference signal generator circuit 4. Then, the comparator supplies the resulting comparison result signals to an A/D converter 52_1 of the A/D conversion part 52.

The comparator 51_2, like the comparator 51_1, supplies comparison result signals resulting from comparison between the pixel signals supplied via the vertical signal line 33_2 and the ramp signal to an A/D converter 52_2 of the A/D conversion part 52.

As below, similarly, the comparator 51_m supplies comparison result signals resulting from comparison between the pixel signals supplied via the vertical signal line 33_m and the ramp signal to an A/D converter 52_m of the A/D conversion part 52.

The A/D conversion part 52 has m A/D converters 52_1 to 52_m.

To the A/D converters 52_1 to 52_m, comparison result signals are supplied from the comparators 51_1 to 51_m of the voltage comparison part 51, respectively.

Each of the A/D converters 52_1 to 52_m includes a latch and plural TFFs (Toggle Flip-Flop) (e.g., 13 TFFs), and outputs pixel data in number of bits according to the number of TFFs.

That is, to the A/D converters 52_1 to 52_m, comparison result signals are supplied from the comparators 51_1 to 51_m, and counter clock signals at a predetermined frequency and predetermined control signals are supplied from the timing control unit 1.

Then, the A/D converters 52_1 to 52_m count the counter clock signals supplied from the timing control unit 1 according to the comparison result signals supplied from the comparators 51_1 to 51_m and the control signals supplied from the timing control unit 1. Thereby, the converters A/D-convert the analog pixel signals output from the pixels 31_11 to 31_mn of the pixel array 3 and output resulting pixel data.

The sensitivity amplification part 53 has plural amplifiers (in number corresponding to that of the TFFs), and amplifies the pixel data output from the A/D conversion part 52, and outputs the data to an image processing circuit etc. at the downstream via the timing control unit 1.

The horizontal transfer scan circuit 6 has a horizontal decoder 61 and a horizontal drive circuit 62.

The horizontal transfer scan circuit 6 sequentially controls the plural A/D converters 52_1 to 52_m arranged in the horizontal direction of the column A/D converter unit 5 with predetermined timings according to the control signals from the timing control unit 1 to output pixel data.

When pixels in a predetermined column are thinned and pixel data are output from the pixels in the remaining columns, the horizontal decoder 61 generates and supplies a signal for selecting the columns that output pixel signals to the horizontal drive circuit 62.

The horizontal drive circuit 62 generates a control signal for driving the predetermined column.

Next, referring to FIGS. 2A to 2F, an operation example of the CMOS sensor 100 will be explained.

FIGS. 2A to 2F are a timing chart at an operation of the CMOS sensor 100.

Figure 2A:
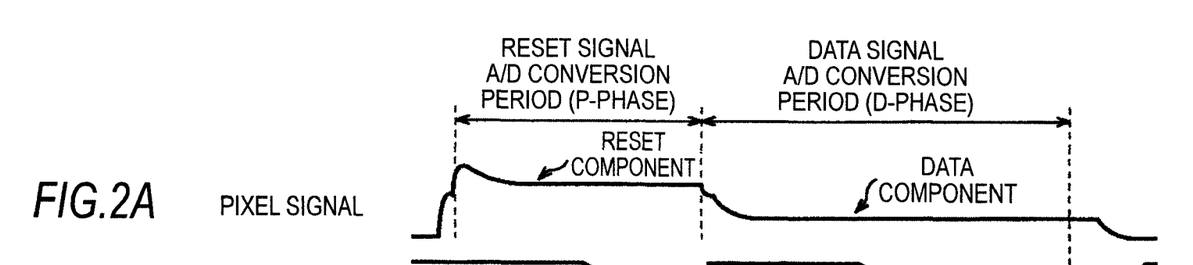
FIGS. 2A to 2F are a timing chart at operation of the CMOS sensor.

FIG. 2A shows a pixel signal output from a pixel 31 of the pixel array 3.

Figures 2B, 2C:
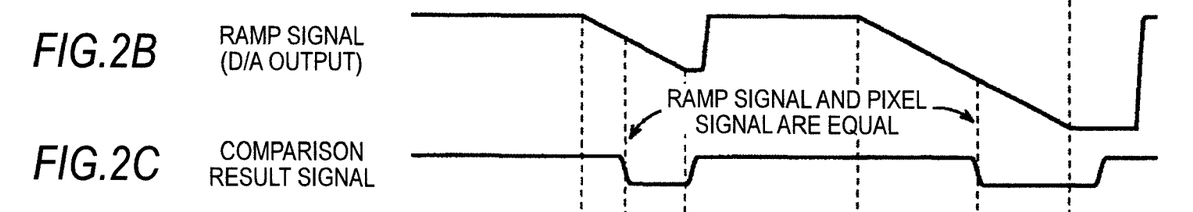

FIG. 2B shows a ramp signal output by the reference signal generator circuit 4.

FIG. 2C shows a comparison result signal output by the voltage comparison part 51.

Figure 2D:
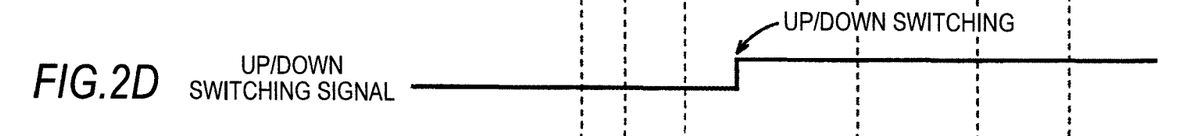

FIG. 2D shows a signal switching between count-up and count-down of the A/D conversion part 52.

Figure 2E:
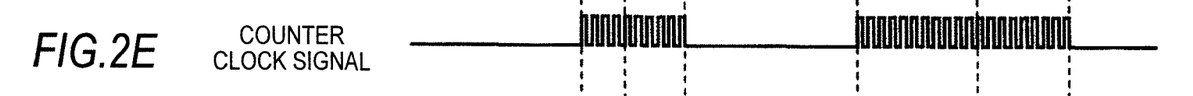

FIG. 2E shows a counter clock signal output by the timing control unit 1.

Figure 2F:
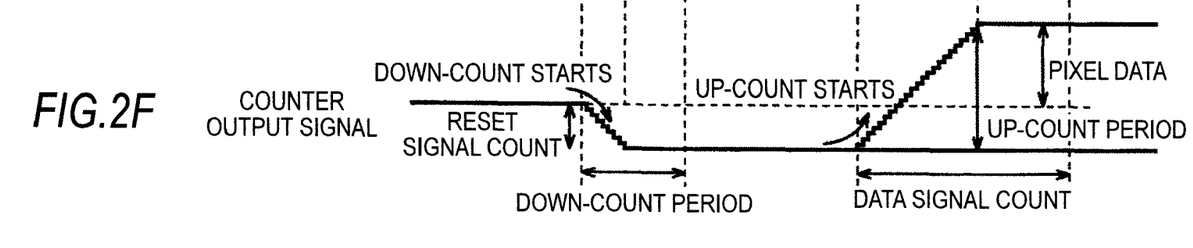

FIG. 2F shows a counter output signal output by the A/D conversion part 52.

As shown in FIG. 2A, the pixel 31 of the pixel array 3 outputs a pixel signal (reset component) according to a predetermined reference potential in a reset signal A/D conversion period (pre-charge phase: P-phase) in response to the control signal supplied from a vertical scan circuit 33. Further, the pixel outputs a pixel signal (data component) according to charge corresponding to received light i of the photodetector (not shown) in a data signal A/D conversion period (data phase: D-phase).

As shown in FIG. 2B, the reference signal generator circuit 4 outputs the ramp signal in which the voltage drops from a predetermined initial voltage at a fixed gradient. In the ramp signal, the period in which the voltage drops corresponding to the reset signal A/D conversion period is longer than the period in which the voltage drops corresponding to the data signal A/D conversion period.

As shown in FIG. 2C, the voltage comparison part 51 compares (the voltages of) the pixel signal and the ramp signal, and, if the pixel signal is equal to or more than the ramp signal, a high-level comparison result signal is output, and, if the pixel signal is less than the ramp signal, a low-level comparison result signal is output.

That is, if the voltage of the ramp signal drops at the fixed gradient, when the ramp signal and the pixel signal are equal, the voltage comparison part 51 outputs a comparison result signal in transition from the high-level to the low-level.

As shown in FIG. 2D, the signal switching between count-up and count-down is supplied from the timing control unit 1 to the A/D conversion part 52. The signal switching between count-up and count-down is at the low-level when the voltage of the ramp signal drops at the fixed gradient in the period of P-phase (P-phase slope) and at the high-level when the voltage of the ramp signal drops at the fixed gradient in the period of D-phase (D-phase slope).

The timing control unit 1 supplies the counter clock signal at a predetermined frequency as shown in FIG. 2E, e.g., a high-speed counter clock signal at 500 MHz to the A/D conversion part 52.

As shown in FIG. 2F, the A/D conversion part 52 counts the counter clock signal and outputs pixel data.

That is, the A/D conversion part 52 is in the count-down mode if the signal switching between count-up and count-down is the low-level. The A/D conversion part 52 starts down-count at the time when the voltage of the ramp signal starts to drop in the P-phase, and holds the count value (reset signal count) obtained by counting until the time when the comparison result signal makes transition from the high-level to the low-level.

Subsequently, the signal switching between count-up and count-down makes transition from the low-level to the high-level, and the A/D conversion part 52 turns into the count-up mode. Then, the A/D conversion part 52 starts the up-count when the voltage of the ramp signal starts to drop in the D-phase, and acquires the count value (data signal count) obtained by counting until the time when the comparison result signal makes transition from the high-level to the low-level. Finally, the A/D conversion part 52 outputs a count value as a difference from the reset signal count as pixel data.

Next, details of the reference signal generator circuit 4 will be explained.

The reference signal generator circuit 4 generates a reference signal for A/D conversion according to kinds and arrangement of colors of color filters forming a color separation filter in the pixel array 3.

Specifically, the circuit receives a count clock CKdac for DAC from the timing control unit 1, generates saw-tooth wave (ramp waveform) in synchronization with the reception, and supplies it as a reference voltage for A/D conversion to the A/D conversion part 52.

The reference signal generator circuit 4 determines an initial voltage (the voltage at start of output of the ramp signal) based on information indicating the initial value of the ramp signal contained in the control signal supplied from the timing control unit 1.

Simultaneously, the circuit sets an amount of voltage change per one clock based on information indicating the gradient (change rate) of the ramp signal contained in the control signal supplied from the timing control unit 1.

Then, the ramp signal at the voltage changed by the amount of voltage change per one count of the counter clock CKdac is generated. That is, the shorter the cycle of the counter clock, the larger the gradient of the ramp signal.

Therefore, in the CMOS sensor 100 of the embodiment, the gradient of the ramp signal is controlled by the count clock CKdac supplied by the timing control unit. Further, by controlling the gradient of the ramp signal, the analog gain at A/D conversion of the image signal in the A/D conversion part 52 can be controlled.

As below, a specific configuration etc. will be explained.

Figure 3A:
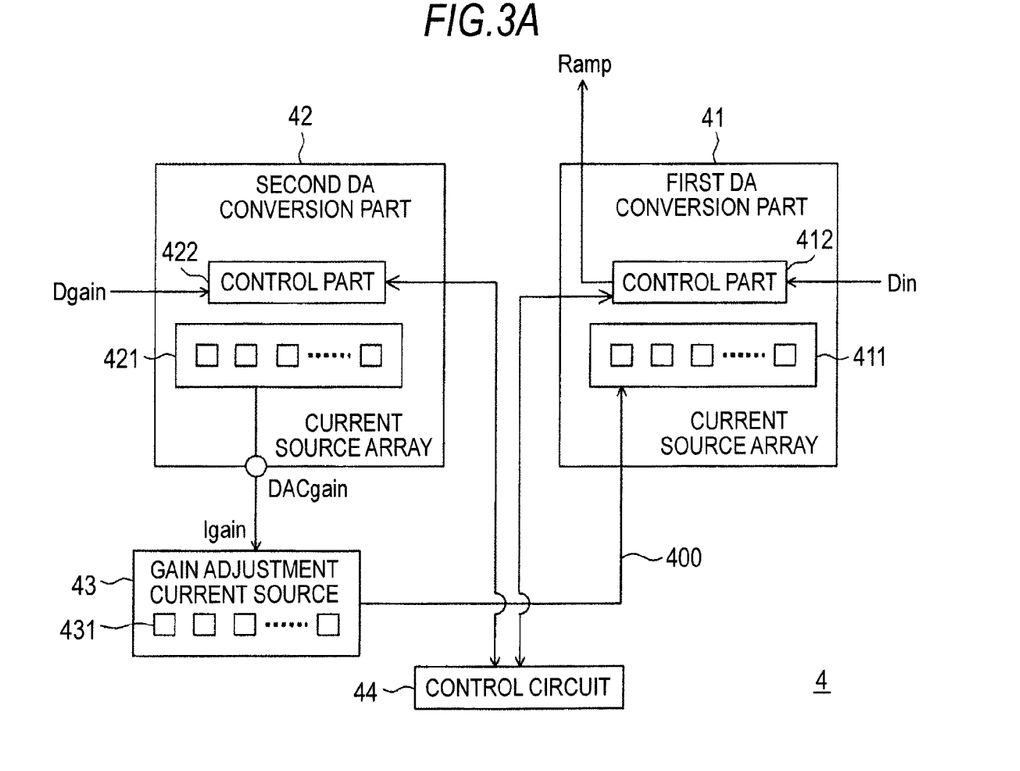
FIGS. 3A and 3B are block diagrams showing a configuration example of a reference signal generator circuit.
Figure 3B:
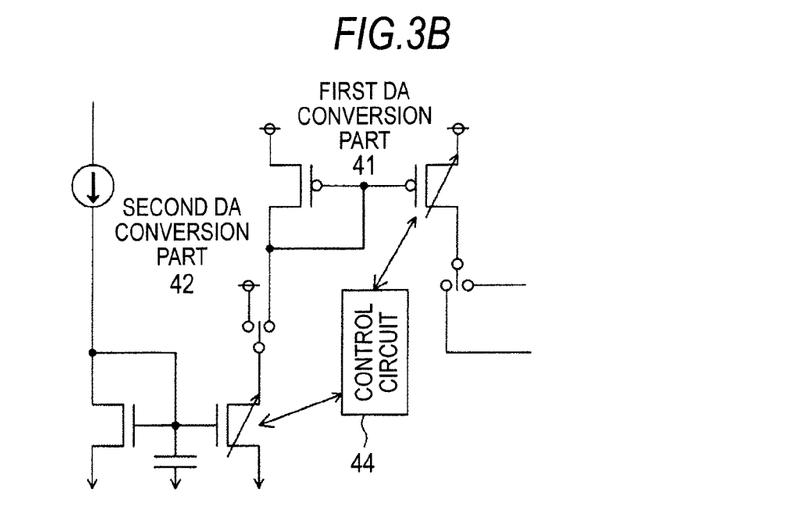

FIGS. 3A and 3B are block diagrams showing a configuration example of the reference signal generator circuit 4.

As shown in FIG. 3A, the reference signal generator circuit 4 has a first D/A conversion part 41, a second D/A conversion part 42, a gain adjustment current source 43, and a control circuit 44.

The first D/A conversion part 41 corresponds to a first digital-analog conversion part of the embodiment of the invention.

The second D/A conversion part 42 corresponds to a second digital-analog conversion part of the embodiment of the invention.

The control circuit 44 corresponds to a control part of the embodiment of the invention.

Further, FIG. 3B shows a circuit diagram of the reference signal generator circuit 4.

The first D/A conversion part 41 generates a sloped ramp signal having a predetermined initial voltage value and a predetermined gradient.

The second D/A conversion part 42 controls (gain-controls) the gradient of the ramp signal generated in the first D/A conversion part 41. The second D/A conversion part 42 has a programmable gain amplifier (PGA) function of controlling the first D/A conversion part 41.

The first and second D/A conversion parts 41, 42 have current source arrays 411, 421 in which plural current sources that generate output current values respectively predeterminedly weighted are provided, and control parts 412, 422 that control selection operation of the current sources.

The current source arrays 411, 421 contain plural current sources, respectively.

The control part 412 of the first D/A conversion part 41 controls D/A conversion processing in the first D/A conversion part 41 in response to a digital control signal Din supplied from the timing control unit 1.

The control part 422 of the second D/A conversion part 42 controls D/A conversion processing in the second D/A conversion part 42 in response to a digital control signal Dgain for gain adjustment supplied from the timing control unit 1.

That is, the first and second D/A conversion parts 41, 42 are current output type D/A converter circuits of controlling the selection operation of the plural current sources by digital processing and performing D/A conversion by adding processing of currents output from the selected current sources.

The gain adjustment current source 43 is located between the first D/A conversion part 41 and second D/A conversion part 42 to be connected to form a current mirror.

That is, the gain adjustment current source 43 forms the current mirror between the respective current sources within the current source array 411 and itself.

The gain adjustment current source 43 includes a predetermined number (e.g., k: k is a positive integer number) of current partition transistors 431 connected in parallel. One of the k current partition transistors 431 and the current source within the current source array 411 of the first D/A conversion part 41 are connected to form a current mirror.

Further, summation current Igain output from the output terminal DACgain of the second D/A conversion part 42 is divided into k and supplied to the current sources of the first D/A conversion part 41. The summation current Igain is current obtained by summing all currents output from the current source array 421 of the second D/A conversion part 42.

Each of the k current partition transistors 431 forming the gain adjustment current source 43 functions as a current source that outputs current weighted to Igain/k.

That is, the gain adjustment current source 43 forms current branching channels with high accuracy. Further, through adjustment of the number of the current partition transistors 431, the conversion ratio of current to voltage in the gain adjustment current source 43 that functions as a current/voltage conversion part can be adjusted.

The gain adjustment current source 43 supplies a gain control output signal Vbais generated based on the summation current Igain to the respective current sources forming the current source array 411 of the first D/A conversion part 41 via a current control line 400.

The current source array 411 supplied with the control voltage Vbais determines the current source for use (flowing current) according to the control voltage Vbais.

Consequently, the first D/A conversion part 41 operates with operation current specified by the control voltage Vbais, and generates and outputs a ramp signal.

Therefore, the second D/A conversion part 42 outputs summation current Igain in response to the digital control signal Dgain for gain adjustment setting, and the gain adjustment current source 43 acquiring the current generates the control voltage Vbais.

The control voltage Vbais is supplied to the current source array 411 of the first D/A conversion part 41, and the current source for flowing current is selected and the ramp signal is generated.

The gradient of the ramp signal is determined depending on the amplitude of the output voltage of the current source array 411 of the first D/A conversion part 41, and thus, the gradient of the ramp signal is determined in response to the control signal Dgain input to the second D/A conversion part 42.

Changing the gradient of the ramp signal means making gain adjustment to the ramp signal.

In the A/D conversion processing in the single-slope integration-type A/D converter like the A/D conversion part 52, the gain adjustment to the ramp signal functions as gain adjustment to the pixel signal as a target of comparison.

Therefore, gain adjustment can be made to the pixel signal with bit accuracy of the digital control signal Dgain for gain setting input to the second D/A conversion part 42, and the digital pixel signal with adjusted gain can be obtained after A/D conversion in the A/D conversion part 52.

That is, in the CMOS sensor of the embodiment, the digital control signal Dgain for gain setting is digitally controlled with high accuracy, and consequently, gain adjustment can be made with high accuracy to the analog pixel signal as a target of A/D conversion processing.

Next, the control circuit 44 will be explained.

The control circuit 44 determines the number of current sources for flowing current in the current source array 411 of the first D/A conversion part 41 that realizes the black level in response to the digital control signal Dgain for gain setting input to the second D/A conversion part 42.

The black level corresponds to the initial voltage (the voltage at start of output) of the ramp signal. That is, the control circuit 44 is a circuit for controlling the initial voltage of the ramp signal.

Figures 4A, 4B:
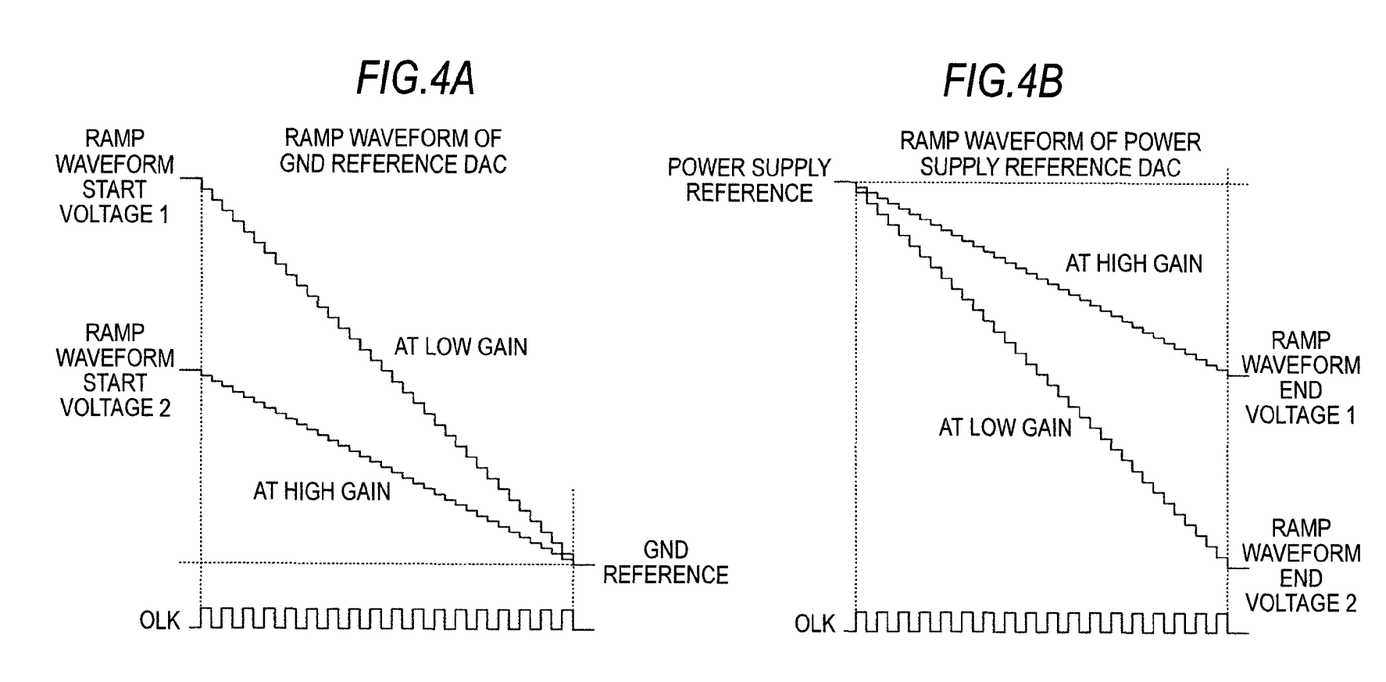
FIGS. 4A and 4B show waveforms of gain settings and ramp signals.

FIGS. 4A and 4B show waveforms of gain settings and ramp signals.

FIG. 4A shows an example of a waveform at high gain and low gain in a GND reference D/A converter circuit when the initial voltage of the ramp signal is not controlled by the control circuit 44.

The GND reference D/A converter circuit is a D/A converter circuit with its reference resistor grounded.

Figure 5A:
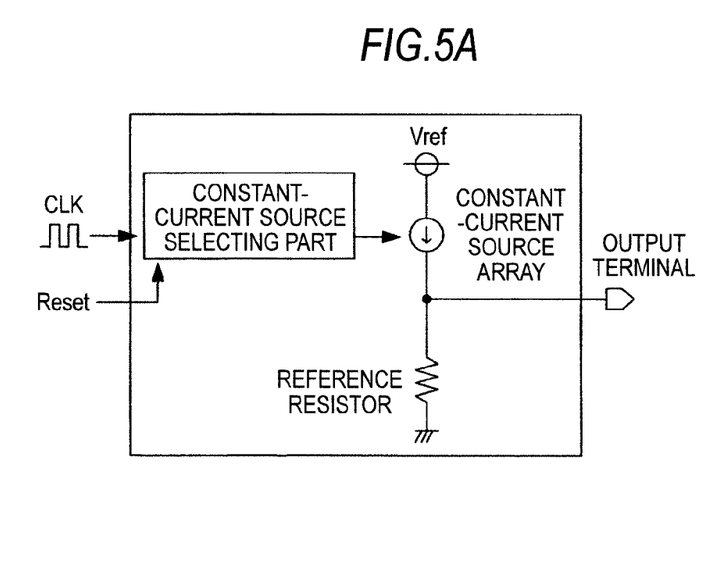
FIGS. 5A and 5B show examples of configurations of D/A converter circuits.

FIG. 5A shows an example of a configuration of the GND reference D/A converter circuit.

Figure 5B:
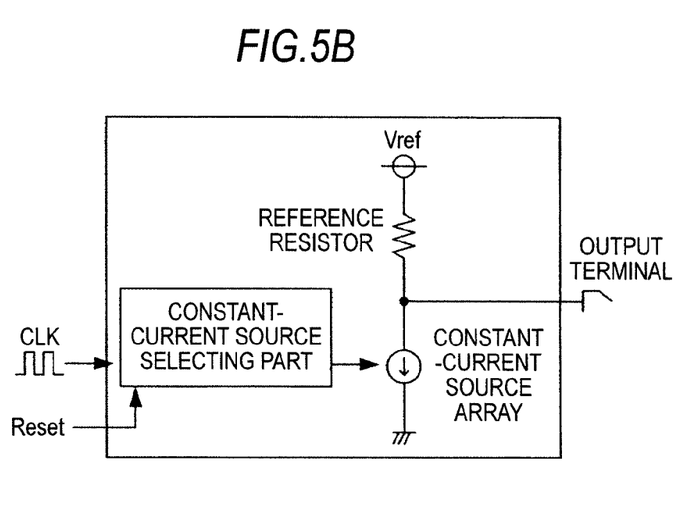

Other than the GND reference D/A converter circuit, there is a power supply reference D/A converter circuit as a D/A converter circuit with its reference resistor connected to the power supply unit, and FIG. 5B shows an example of this configuration.

FIG. 4B shows an example of a waveform at high gain and low gain in the power supply reference D/A converter circuit when the initial voltage of the ramp signal is not controlled by the control circuit 44.

Generally, as a DAC used in the CMOS sensor for supplying the ramp signal, the GND reference D/A converter circuit shown in FIG. 5A is advantageous in view of tolerance for noise. Accordingly, in the embodiment, the case where the first D/A conversion part 41 is the GND reference D/A converter circuit will be explained.

As shown in FIG. 4A, when the initial voltage of the ramp signal is not controlled by the control circuit 44, it is necessary to take the large P-phase range amplitude especially at low gain for securing the amplitude and slope period at high gain. On this account, a situation that the output voltage of the first D/A conversion part 41 increases at low gain and the analog characteristic of the first D/A conversion part 41 becomes deteriorated has occurred.

Figure 6A:
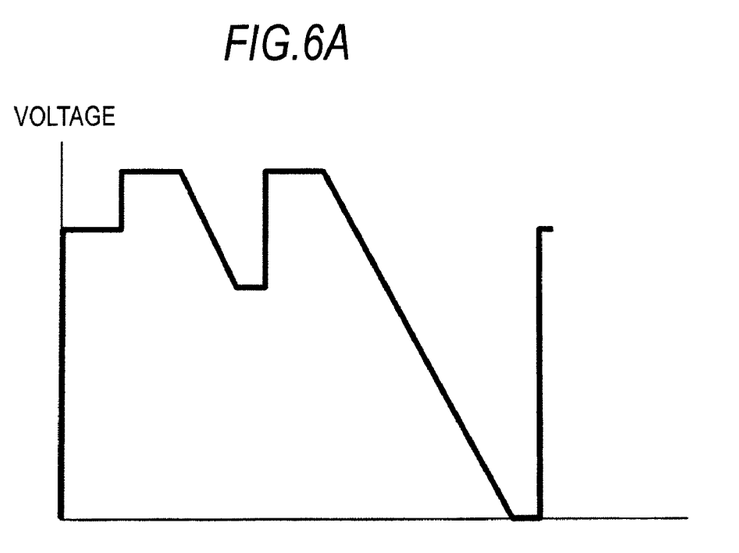
FIGS. 6A and 6B show examples of ramp waveforms when initial voltages of the ramp signals are controlled by a control circuit.

FIG. 6A shows an example of a ramp waveform at low gain when the initial voltage of the ramp signal is controlled by the control circuit 44.

Figure 6B:
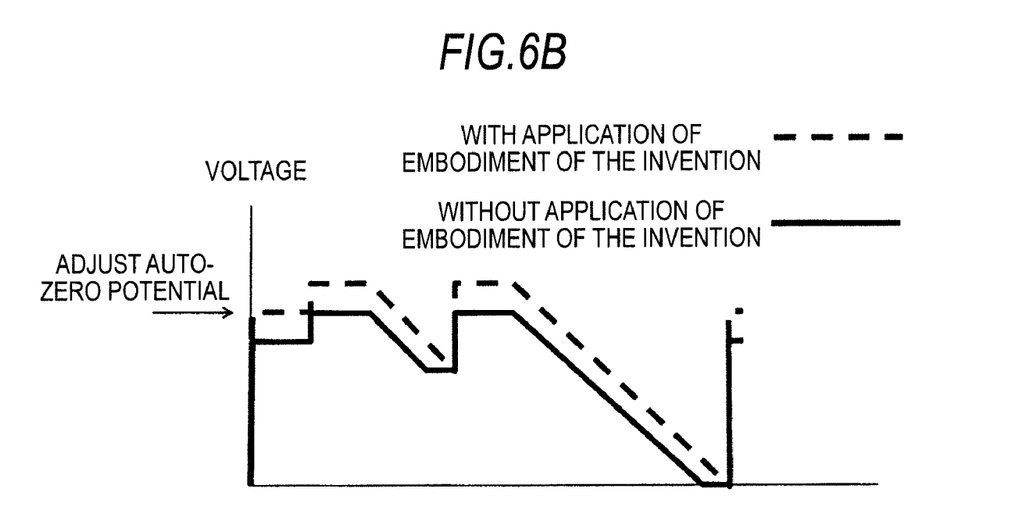

FIG. 6B shows an example of a ramp waveform at high gain when the initial voltage of the ramp signal is controlled by the control circuit 44.

At low gain as shown in FIG. 6A, control is performed so that the amplitude may not be excessively larger by changing the configuration of the first D/A conversion part 41 that generates the initial voltage of the ramp signal. By the control, the sufficient drain-source voltage as the saturation operation of the MOS transistor forming the current source can be secured and the analog characteristic at low gain is improved.

Further, as shown in FIG. 6A, for stabilization of the ramp signal end voltage at the P-phase end, control of masking the clock signal for the control part 412 of the first D/A conversion part 41 is performed so that the first D/A conversion part 41 may not generate the ramp signal even when the clock signal is input.

Furthermore, as shown in FIG. 6B, the P-phase range is expanded and the POF value is adjusted at high gain, and thereby, the CDS (Correlated Double Sampling) operation of the CMOS sensor 100 can be performed more stably at a higher speed without delay. At high gain, the auto-zero voltage is adjusted according to the expansion of the P-phase range.

Figure 7:
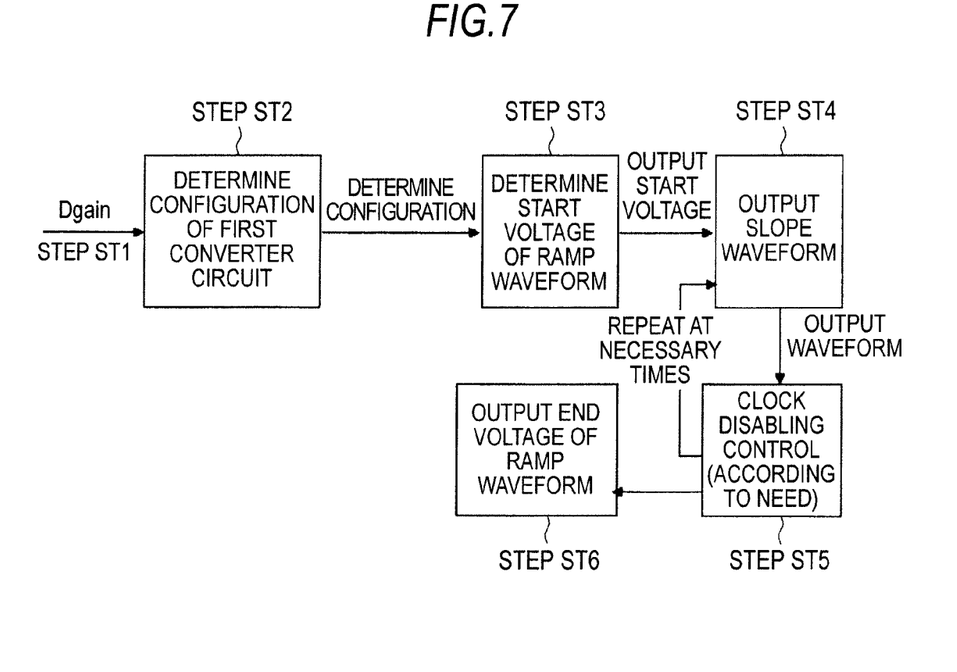
FIG. 7 is a flowchart for explanation of an operation example of the reference signal generator circuit at operation of the control circuit.

As below, an operation example of the control circuit 44 will be explained.

FIG. 7 is a flowchart for explanation of an operation example of the reference signal generator circuit 4 at operation of the control circuit 44.

Step ST1:

The control signal Dgain for gain setting input to the second D/A conversion part 42 is input to the control circuit 44.

Step ST2:

The control circuit 44 determines the initial voltage of the ramp signal in response to the control signal Dgain input at step ST1 and transmits it to the control part 412 of the first D/A conversion part 41.

Step ST3:

The first D/A conversion part 41 generates the ramp signal according to the initial voltage of the ramp signal set at step ST2.

Step ST4:

The control circuit 44 masks the clock signal input to the first D/A conversion part 41 for stabilizing the end voltage at low-gain operation.

The steps ST3 and ST4 are repeated at necessary times according to need.

Step ST5:

The first D/A conversion part 41 outputs the ramp signal generated at steps ST3 and ST4.

In the above described explanation, the case where the GND reference D/A converter circuit with its reference resistance grounded is adopted as the first D/A conversion part 41 is explained. However, the embodiment of the invention is not limited to that. The embodiment of the invention can be applied to the case where the first D/A conversion part 41 is the power supply reference D/A converter circuit whose reference resistance is connected to the power supply unit as shown in FIG. 5B. Note that, though the detailed explanation is omitted, the control circuit 44 controls not the initial voltage of the ramp signal but the end voltage in this case.

As explained above, according to the CMOS sensor 100 of the embodiment, the reference signal generator circuit 4 has the first D/A conversion part 41, the second D/A conversion part 42, the gain adjustment current source 43, and the control circuit 44. The control circuit 44 controls the initial voltage of the ramp signal generated in the first D/A conversion part 41 in response to the control signal Dgain input to the second D/A conversion part 42.

Thereby, the analog characteristic at low gain in the first D/A conversion part 41 is improved. Further, for stabilization of the ramp signal end voltage at the P-phase end, control of masking the clock signal for the control part 412 of the first D/A conversion part 41 is performed so that the first D/A conversion part 41 may not generate the ramp signal even when the clock signal is input. Furthermore, the P-phase range is expanded and the POF value is adjusted at high gain, and thereby, the CDS (Correlated Double Sampling) operation of the CMOS sensor 100 can be performed more stably at a higher speed without delay.

The CMOS sensor 100 of the above described embodiment can be applied as a solid-state imaging device to an imaging apparatus such as a digital camera, for example.

As below, an application example will be explained.

Figure 8:
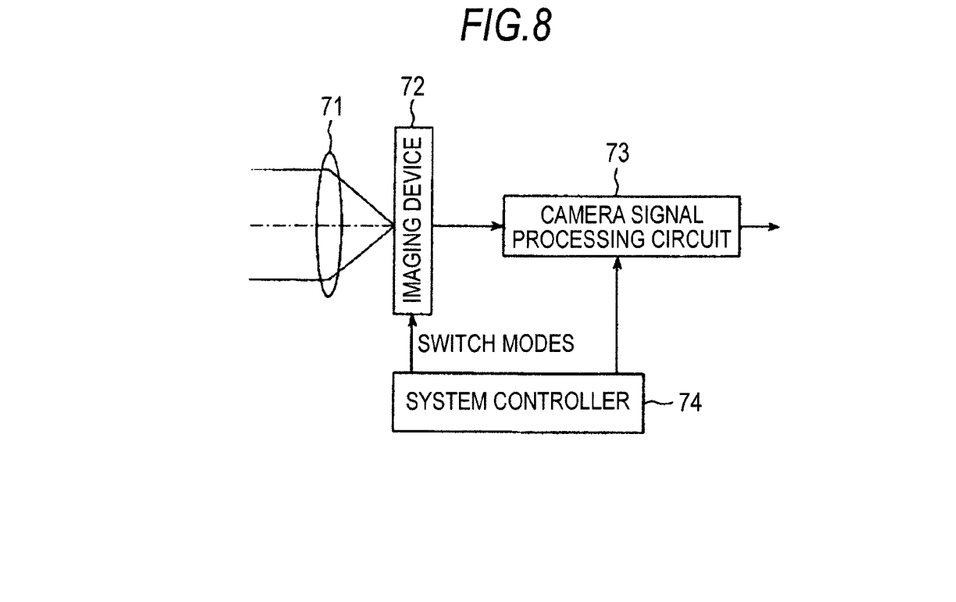
FIG. 8 is a block diagram showing an example of a configuration of an imaging apparatus.

FIG. 8 is a block diagram showing an example of a configuration of an imaging apparatus 300.

As shown in FIG. 8, the imaging apparatus 300 includes an optical system 71 containing lenses (corresponding to an optical system of an embodiment of the present invention), an imaging device 72, a camera signal processing circuit 73, a system controller 74, etc.

The optical system 71 corresponds to an optical system of an embodiment of the invention.

The optical system 71 focuses image light from a subject onto an imaging surface of the imaging device 72 with a lens or the like. The imaging device 72 outputs image signals obtained by converting the image light focused on the imaging surface by the optical system 71 into electric signals in units of pixels. As the imaging device 72, the CMOS sensor 100 with column parallel ADC according to the above described embodiment is used.

The camera signal processing circuit 73 performs various signal processing on the image signals output from the imaging device 72. The system controller 74 performs control on the imaging device 72 and the camera signal processing circuit 73.

Especially, the column parallel ADC of the imaging device 72 has a normal frame rate mode in the progressive scan system of reading out information on all pixels. Further, the column parallel ADC of the imaging device 72 has a high-speed frame mode in which the exposure time of pixels is set to 1/N and the frame rate is increased to N times the frame rate in the normal frame rate mode. In this case, in the column parallel ADC of the imaging device 72, if the AD conversion operations corresponding to the respective operation modes can be performed, switching between the operation modes can be controlled according to an external instruction.

The present invention is not limited to the above described embodiments.

That is, in the practice of the present invention, various changes and alterations can be made to the component elements in the above described embodiments within the technical scope of the present invention and the equivalent scope thereof.

The present application contains subject matter related to that disclosed in Japanese Priority Patent Application JP 2008-224165 filed in the Japan Patent Office on Sep. 1, 2008, the entire contents of which is hereby incorporated by reference.

What is claimed is:

1. A digital-analog converter circuit comprising:
a first digital-analog conversion part that obtains an analog output signal in response to a value of a digital input signal; and
a second digital-analog conversion part that generates a control signal in response to a value of a digital gain control input signal externally input,
wherein the first digital-analog conversion part adjusts a start voltage or end voltage of the analog output signal based on the digital gain control input signal for controlling the second digital-analog conversion part.

2. The digital-analog converter circuit according to claim 1, wherein the first digital-analog conversion part has plural current sources that can output constant currents predeterminedly weighted, and adds and outputs the constant current outputs of selected current sources of the plural current sources and generates an output current in response to the value of the digital input signal as the analog output signal, and
the second digital-analog conversion part has plural current sources that can output constant currents predeterminedly weighted, and adds and outputs the constant current outputs of selected current sources of the plural current sources and generates an output current in response to the value of the digital input gain control signal, and supplies the control signal based on the generated output current to the first digital-analog conversion part.

3. The digital-analog converter circuit according to claim 2, further comprising a control part that determines the selected current sources of the plural current sources of the first digital-analog conversion part based on the control signal generated by the second digital-analog conversion part,
wherein the control part adjusts the start voltage or end voltage of the analog output signal generated by the selection of the current sources for flowing currents from the plural current sources of the first digital-analog conversion part.

4. The digital-analog converter circuit according to claim 3, wherein the first digital-analog conversion part generates the analog output signal in response to an input clock signal, and
the control part adjusts the start voltage or end voltage of the analog output signal, and thereby, controls the first digital-analog conversion part not to generate the analog output signal in response to the clock signal after timing when it becomes unnecessary to generate the analog output signal.

5. A solid-state imaging device comprising:
a pixel unit that has plural pixels and outputs analog pixel signals;
a digital-analog converter circuit that generates a ramp signal having a predetermined initial voltage and a fixed gradient; and
an analog-digital converter unit that compares the analog pixel signals output by the pixel unit with the ramp signal generated by the digital-analog converter circuit and digitally converts the analog pixel signals based on a comparison time,
wherein the digital-analog converter circuit has a first digital-analog conversion part that obtains an analog output signal in response to a value of a digital input signal and a second digital-analog conversion part that obtains an analog gain control output signal in response to a value of a digital gain control input signal, and adjusts a start voltage or end voltage of the first digital-analog conversion part based on a control signal generated by the second digital-analog conversion part.

6. An imaging apparatus comprising:
a solid-state imaging device having plural pixels; and
an optical system that focuses light from a subject onto the pixels of the solid-state imaging device,
wherein the solid-state imaging device includes a pixel unit that has plural pixels and outputs analog pixel signals,
a digital-analog converter circuit that generates a ramp signal having a predetermined initial voltage and a fixed gradient, and
an analog-digital converter unit that compares the analog pixel signals output by the pixel unit with the ramp signal generated by the digital-analog converter circuit and digitally converts the analog pixel signals based on a comparison time, and
the digital-analog converter circuit has a first digital-analog conversion part that obtains an analog output signal in response to a value of a digital input signal and a second digital-analog conversion part that obtains an analog gain control output signal in response to a value of a digital gain control input signal, and adjusts a start voltage or end voltage of the first digital-analog conversion part based on a control signal generated by the second digital-analog conversion part.

* * * * *